(12) United States Patent
Park et al.

(10) Patent No.: US 11,728,280 B2
(45) Date of Patent: Aug. 15, 2023

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Min Won Park, Gyeonggi-do (KR); Tae Yong Lee, Gyeonggi-do (KR); Ji Hun Yi, Gyeonggi-do (KR); Cheol Ho Lee, Incheon (KR)

(73) Assignee: Amkor Technology Singapore Holding Pte. Lid., Singapore (SG)

( * ) Notice: Subject to any disclaimer, the term of this patent is extended or adjusted under 35 U.S.C. 154(b) by 293 days.

(21) Appl. No.: 17/150,537

(22) Filed: Jan. 15, 2021

(65) Prior Publication Data
US 2022/0230967 A1 Jul. 21, 2022

(51) Int. Cl.
*H01L 23/552* (2006.01)
*H01L 23/31* (2006.01)
*H01L 23/538* (2006.01)
*H01L 23/00* (2006.01)
*H01L 21/48* (2006.01)
*H01L 21/56* (2006.01)

(52) U.S. Cl.
CPC ........ *H01L 23/552* (2013.01); *H01L 21/4853* (2013.01); *H01L 21/565* (2013.01); *H01L 21/568* (2013.01); *H01L 23/3128* (2013.01); *H01L 23/5386* (2013.01); *H01L 24/19* (2013.01); *H01L 24/20* (2013.01); *H01L 2224/214* (2013.01); *H01L 2924/3025* (2013.01)

(58) Field of Classification Search
CPC . H01L 23/552; H01L 21/4853; H01L 21/565; H01L 21/568; H01L 23/3128; H01L 23/5386; H01L 24/19; H01L 24/20; H01L 2224/214; H01L 2924/3025
See application file for complete search history.

(56) References Cited

U.S. PATENT DOCUMENTS

| | | | |
|---|---|---|---|
| 10,177,095 B2 | 1/2019 | Han et al. | |
| 10,553,542 B2* | 2/2020 | Shin | H01L 21/4853 |
| 2018/0269181 A1* | 9/2018 | Yang | H01L 21/561 |
| 2020/0161252 A1* | 5/2020 | Yang | H01L 23/552 |
| 2020/0211975 A1* | 7/2020 | Dhakal | H01L 23/49816 |

* cited by examiner

*Primary Examiner* — Fernando L Toledo
*Assistant Examiner* — Neil R Prasad
(74) *Attorney, Agent, or Firm* — Kevin B. Jackson

(57) ABSTRACT

In one example, an electronic device includes a substrate comprising a substrate top side, a substrate bottom side, and outward terminals. An electronic component is connected to the outward terminals. External interconnects are connected to the outward terminals and include a first external interconnect connected to a first outward terminal. A lower shield is adjacent to the substrate bottom side and is laterally between the external interconnects. The lower shield is electrically isolated from the first external interconnect by one or more of 1) a dielectric buffer interposed between the lower shield and the first external interconnect; or 2) the lower shield including a first part and a second part, the first part being laterally separated from the second part by a first gap, wherein the first part laterally surrounds lateral sides of the first external interconnect; and the second part is vertically interposed between the first outward terminal and the first external interconnect. Other examples and related methods are also disclosed herein.

20 Claims, 13 Drawing Sheets

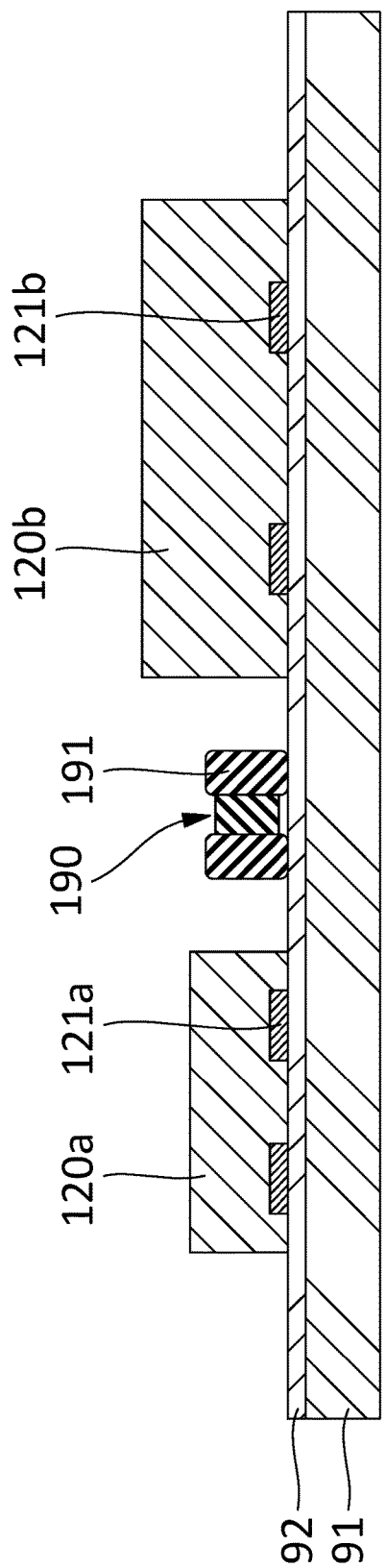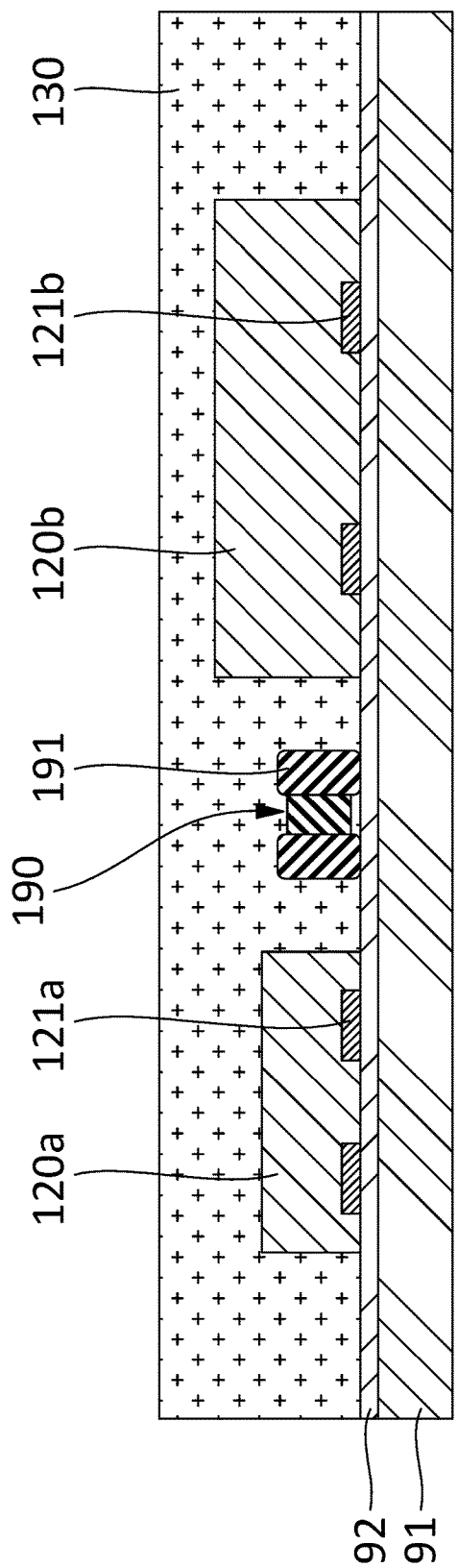
FIG.2A
FIG.2B

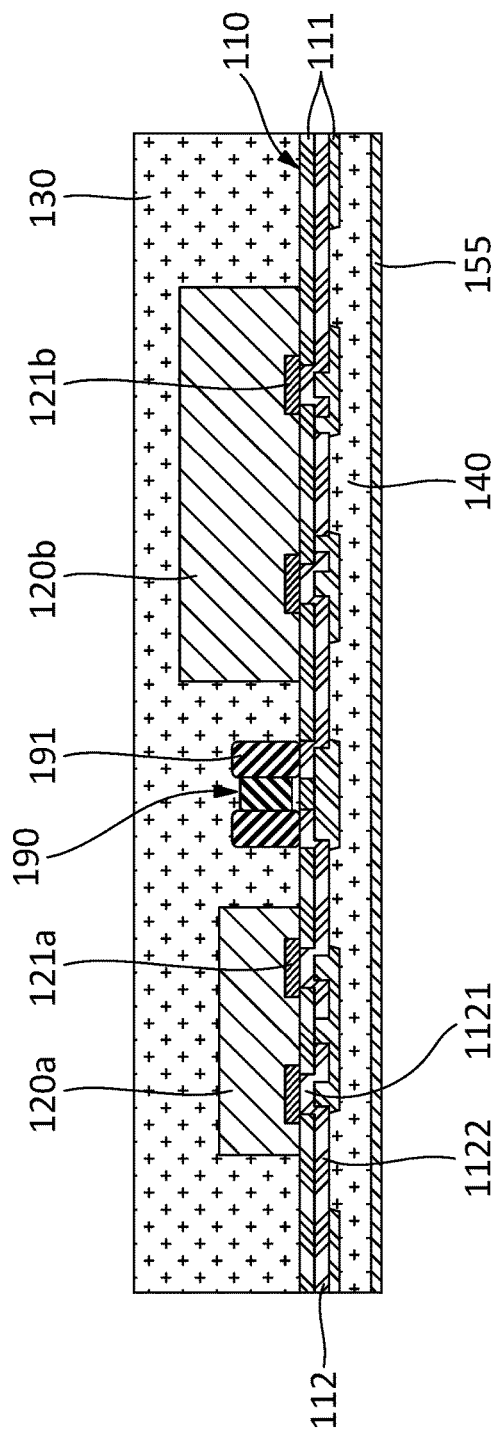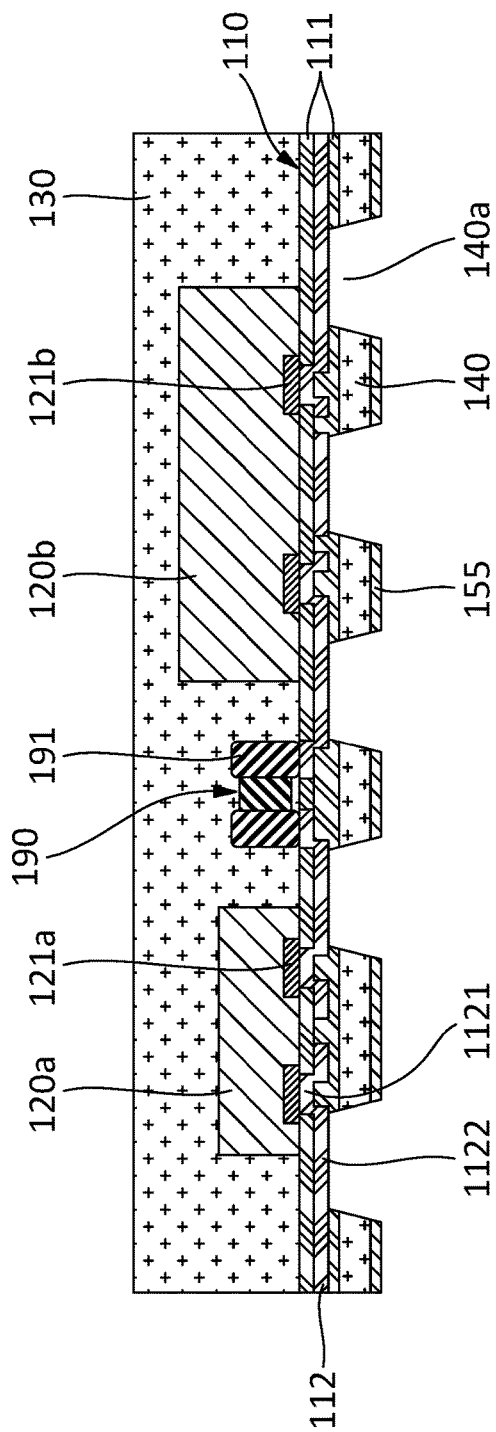

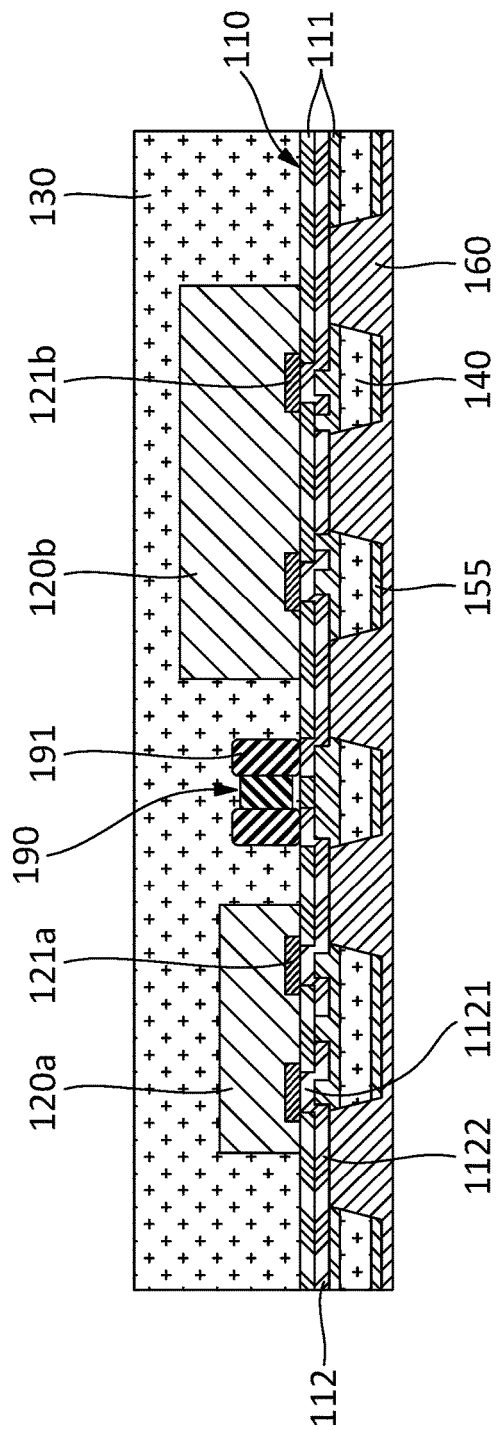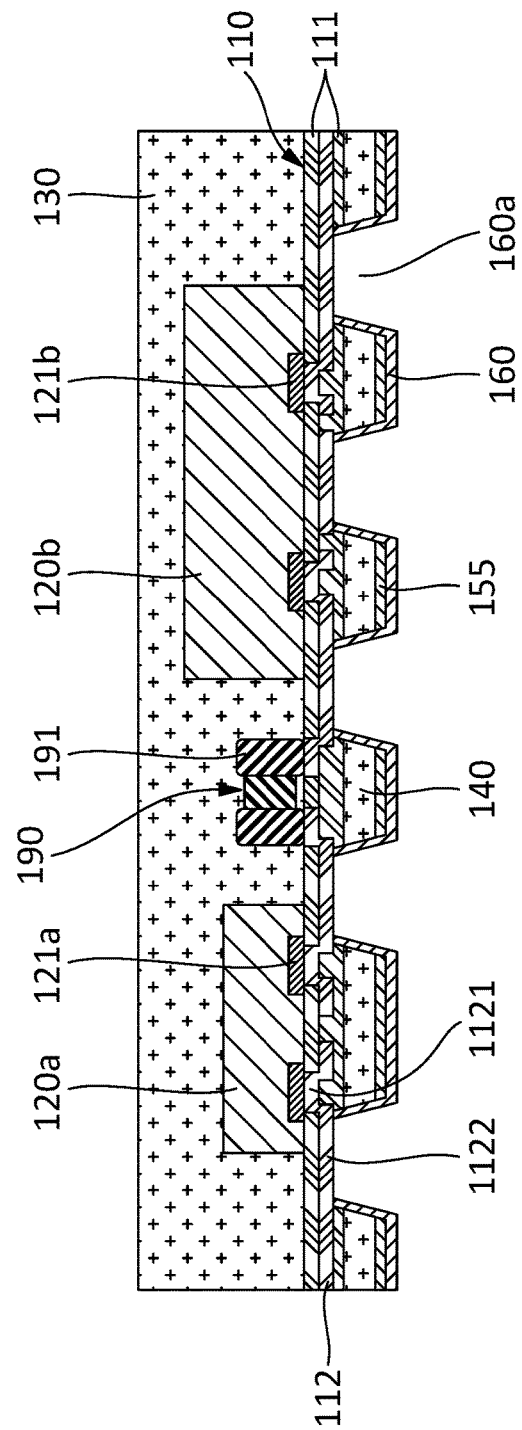

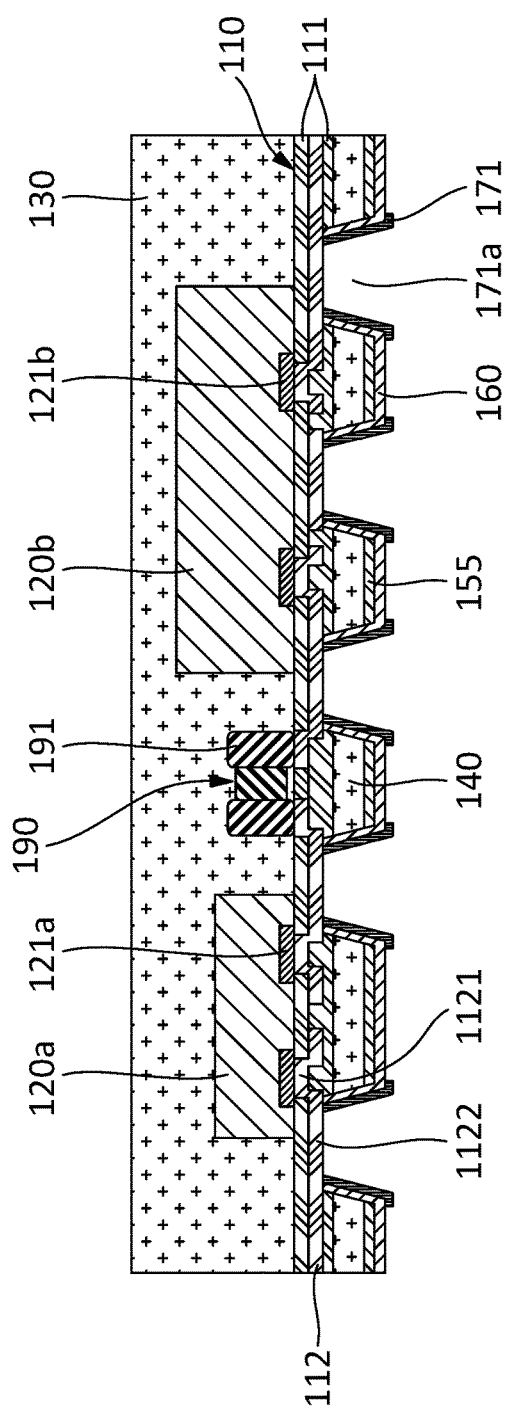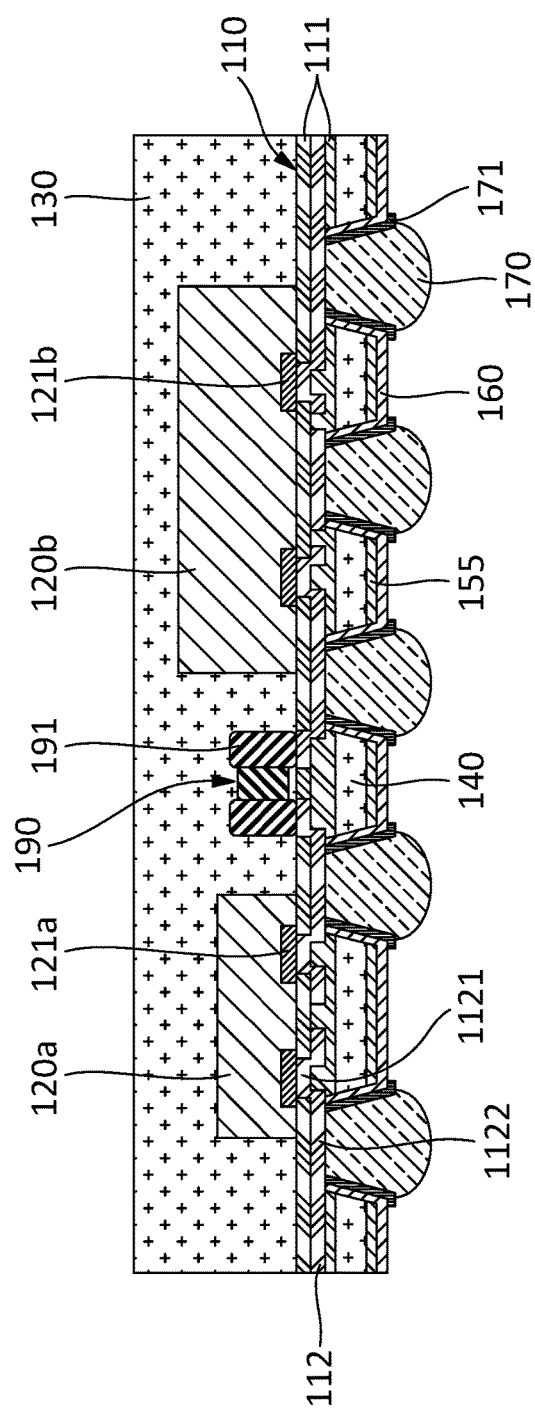

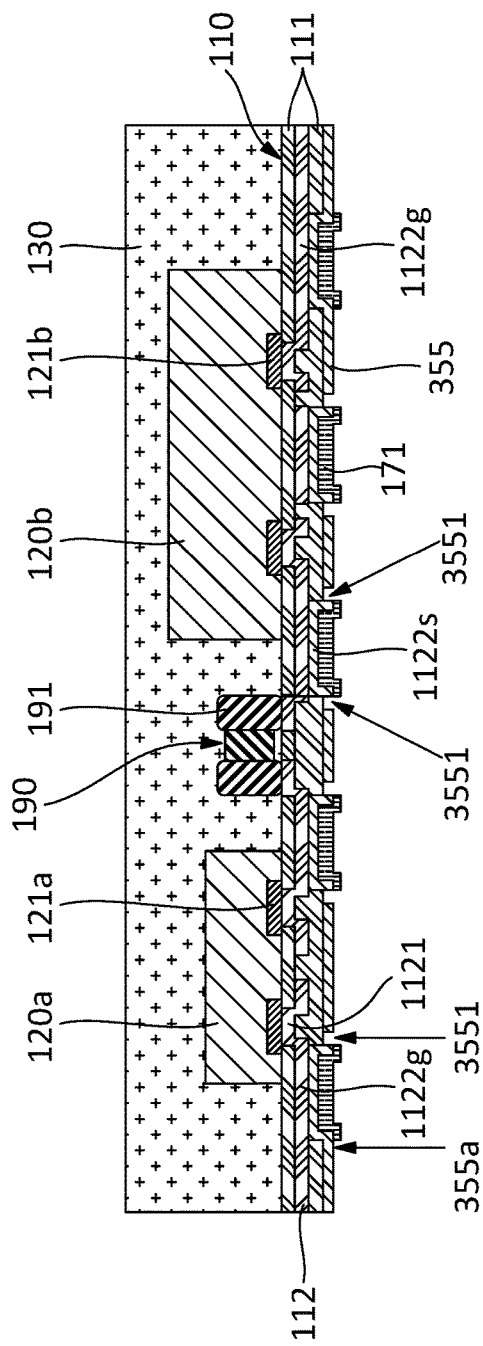
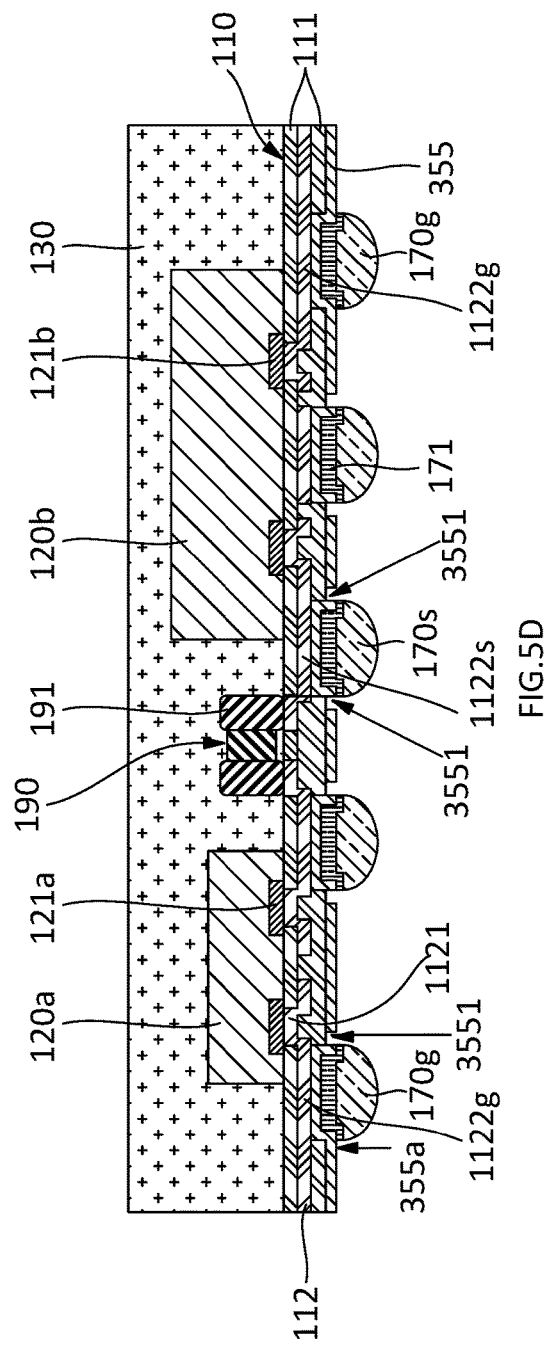
FIG.5C
FIG.5D

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, 2H, 2I, 2J and 2K show cross-sectional views of an example method for manufacturing an example electronic device.

FIGS. 5A, 5B, 5C, 5D, and 5E show cross-sectional views of an example method for manufacturing an example electronic device.

Figure 1:
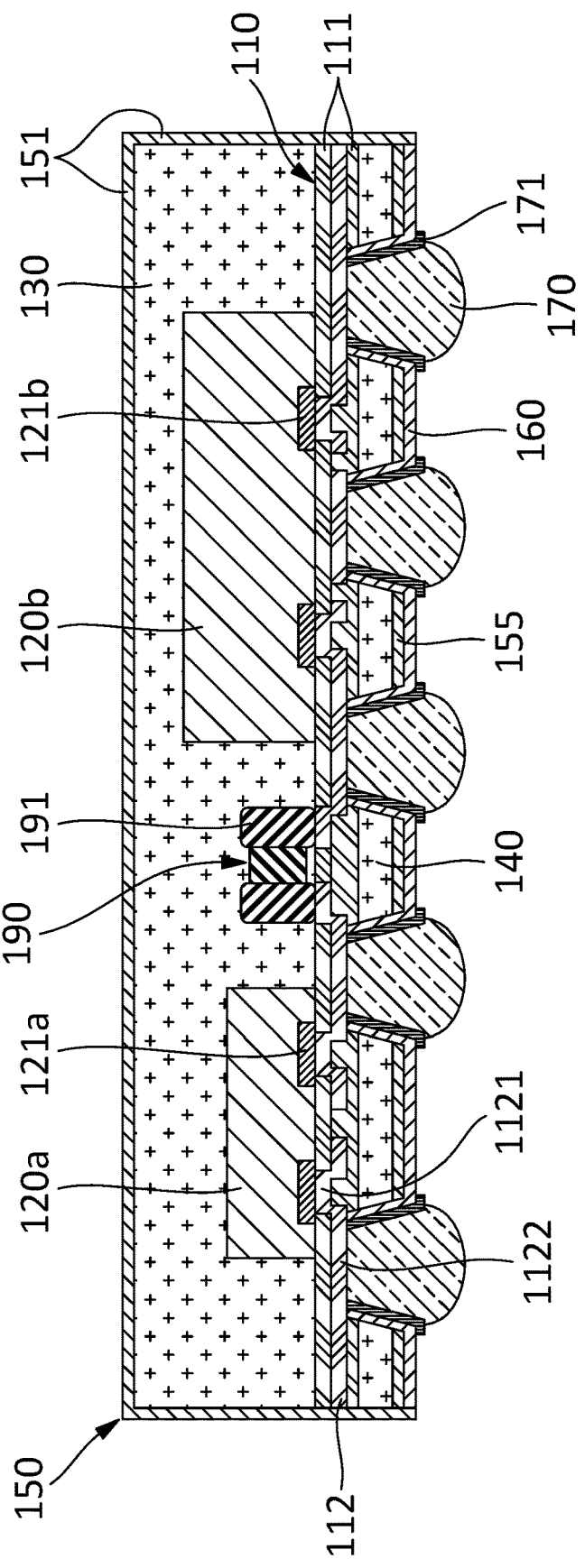
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, an electronic device, includes a substrate having a substrate top side; a substrate bottom side opposite to the substrate top side; substrate lateral sides; a conductive structure comprising inward terminals and outward terminals; and a dielectric structure covering portions of the conductive structure. A first electronic component is coupled to inward terminals adjacent to the substrate top side. A first encapsulant covering portions of the substrate and at least portions of the first electronic component, the first encapsulant comprising a first encapsulant top side and first encapsulant lateral sides. External interconnects connected to the outward terminals including a first external interconnect connected to a first outward terminal. A first shield is adjacent to the first encapsulant top side and the first encapsulant lateral side. A second shield is adjacent to the substrate bottom side and is laterally between the external interconnects. The second shield is electrically isolated from the first external interconnect by one or more of i) a dielectric buffer interposed between the second shield and the first external interconnect; or ii) the second shield comprising a first part and a second part, the first part being laterally separated from the second part by a first gap, wherein the first part of the second shield laterally surrounds lateral sides of the first external interconnect; and the second part of the second shield is vertically interposed between the first outward terminal and the first external interconnect.

In an example, an electronic device includes a substrate comprising a substrate top side, a substrate bottom side, and outward terminals. An electronic component is connected to the outward terminals. External interconnects are connected to the outward terminals and include a first external interconnect connected to a first outward terminal. A lower shield is adjacent to the substrate bottom side and is laterally between the external interconnects. The lower shield is electrically isolated from the first external interconnect by one or more of 1) a dielectric buffer interposed between the lower shield and the first external interconnect; or 2) the lower shield including a first part and a second part, the first part being laterally separated from the second part by a first gap, wherein the first part laterally surrounds lateral sides of the first external interconnect; and the second part is vertically interposed between the first outward terminal and the first external interconnect.

In an example, a method of manufacturing an electronic device, includes providing a sub-assembly, which comprises a substrate comprising a substrate top side; a substrate bottom side opposite to the substrate top side, substrate side sides; a conductive structure comprising inward terminals and outward terminals; and a dielectric structure covering portions of the conductive structure; a first electronic component coupled to the substrate top side; and a first encapsulant covering portions of the substrate and at least portions of the first electronic component, the first encapsulant comprising a first encapsulant top side and first encapsulant lateral sides. The method includes forming first shield over the first encapsulant top side and the first encapsulant lateral sides. The method includes forming a second shield over the substrate bottom side. The method includes providing external interconnects adjacent to the substrate bottom side and coupled to the outward terminals including a first external interconnect coupled to a first outward terminal. The method includes electrically isolating the second shield from a first external interconnect by one or more of a) providing a dielectric buffer interposed between the second shield and the first external interconnect; or b) providing the second shield comprising a first part and a second part, the first part being laterally separated from the second part by a first gap, wherein the first part of the second shield laterally surrounds lateral sides of the first external interconnect; and the second part of the second shield is vertically interposed between the first outward terminal and the first external interconnect.

Other examples are included in the present disclosure. Such examples may be found in the figures, in the claims, or in the description of the present disclosure.

FIG. 1 shows a cross-sectional view of an example semiconductor device 10. In the example shown in FIG. 1, electronic device 10 can comprise substrate 110, electronic components 120a or 120b, electronic component 190, upper encapsulant 130, lower encapsulant 140, shield 150, dielectric buffer 160, and external interconnect 170.

Substrate 110 can comprise dielectric structure 111 and conductive structure 112. Conductive structure 112 can comprise inward terminal 1121 and outward terminal 1122. Electronic components 120a or 120b can comprise component interconnects 121a or 121b. Electronic component 190 can comprise component interconnect 191. Shield 150 can comprise upper shield 151 or lower shield 155. External interconnects 170 can be coupled with outward terminals 1122, whether directly or through optional under bump metallization (UBM) 171. Upper shield 151 can comprise an upper shield top portion and an upper shield lateral portion. Lower Shield 155 can cover a majority of the bottom of lower encapsulant 140. In some examples, lower shield 155 can vertically surround lateral sides of external interconnect 170.

Substrate 110, upper encapsulant 130, lower encapsulant 140, shield 150, dielectric buffer 160, and external interconnect 170 can be referred to as a semiconductor package and can provide protection for electronic components 120a, 120b, or 190 from external elements or environmental exposure. In addition, the semiconductor package can provide electrical coupling between external electrical components and external interconnects 170.

Figure 2C:
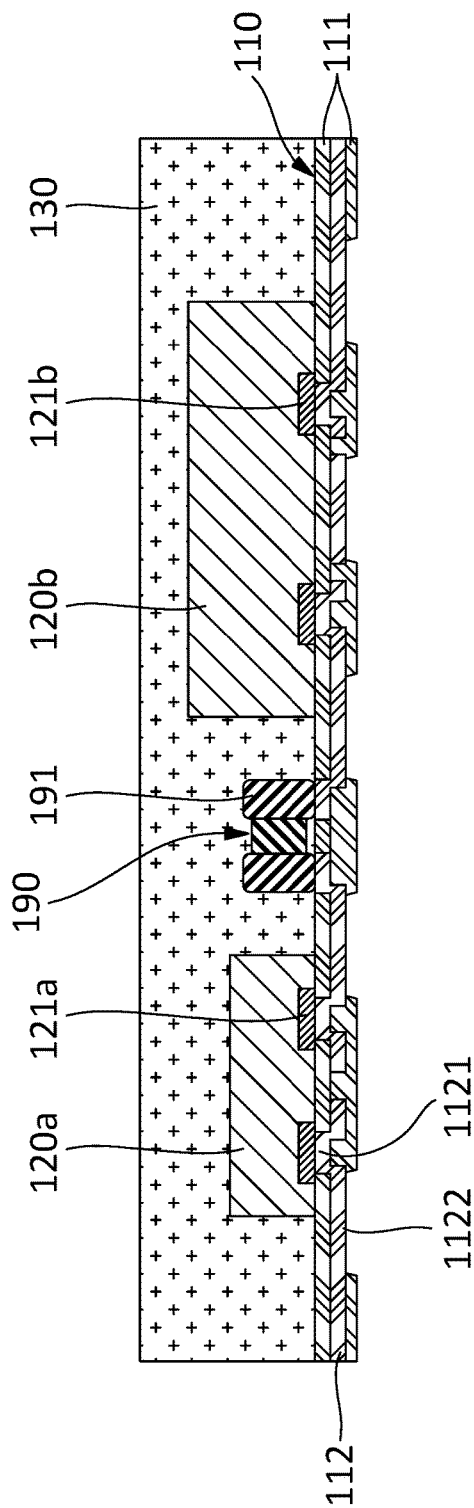

FIGS. 2A to 2K show cross-sectional views of an example method for manufacturing electronic device 10. FIG. 2A shows a cross-sectional view of electronic device 10 at an early stage of manufacture.

In the example shown in FIG. 2A, electronic components 120a, 120b, or 190 can be provided on support carrier 91. In some examples, temporary adhesive 92 can be provided on support carrier 91, and electronic components 120a, 120b, or 190 can be provided on temporary adhesive 92. In some examples, component interconnects 121a, 121b, or 191 of electronic components 120a, 120b, or 190 can be coupled to temporary adhesive 92.

In some examples, support carrier 91 can comprise or be referred to as a wafer, a panel, or a plate. In some examples support carrier 91 can comprise silicon, glass, ceramic, or metal material. In some examples, support carrier 91 can comprise or be referred to as a lower grade printed circuit board or a lower grade leadframe. In some examples, support carrier 91 can be in the form of a disk or a quadrangular (e.g., rectangular or square) plate shape. Support carrier 91 can support electronic components 120a, 120b, or 190, and upper encapsulant 130, during the manufacturing process. In some examples, temporary adhesive 92 can be made of a material whose adhesive strength can be reduced or peeled off by light (e.g., a laser beam), heat, a chemical solution, or external force. In some examples, the temporary adhesive 92 can be referred to as a temporary adhesive tape, film, or layer.

In some examples, electronic components 120a or 120b can comprise or be referred to as a chip, die, semiconductor device, electronic device, or packaged device. In some examples, the chip or die can comprise an integrated circuit die separated from the semiconductor wafer. In some examples, electronic components 120a or 120b can comprise digital signal processors (DSPs), network processors, power management units, audio processors, RF circuits, wireless baseband system on a chip (SoC) processors, sensors, and custom integrated circuits. In some examples, electronic component 120a can comprise a processor or controller, and electronic component 120b can comprise one or more memory chips. In some examples, both of electronic components 120a and 120b can be processors or memory chips. In some examples, electronic component 190 can comprise or be referred to as a passive component, an integrated passive device, a capacitor, an inductor, or a diode. In some examples, the thickness of electronic components 120a, 120b, or 190 can be approximately 50 µm (micrometers) to approximately 900 µm. In some examples, component interconnects 121a, 121b, or 191 can comprise or be referred to as pads, bumps, balls, or pillars. In some examples, component interconnects 121a or 121b can comprise metals such as copper (Cu), aluminum (Al), gold (Au), silver (Ag), nickel (Ni), palladium (Pd), or tin (Sn). In some examples, the width or thickness of component interconnects 121a, 121b, or 191 can be between approximately 10 µm and approximately 300 µm.

FIG. 2B shows a cross-sectional view of electronic device 10 at a later stage of manufacture. In the example shown in FIG. 2B, upper encapsulant 130 can be provided on electronic components 120a, 120b, or 190 on support carrier 91. In some examples, upper encapsulant 130 can comprise or be referred to as a mold compound, resin, sealant, filler-reinforced polymer, or organic body. In some examples, upper encapsulant 130 can comprise an epoxy resin or a phenol resin, a carbon black, a silica filler, or other materials as known to one of ordinary skill in the art. In some examples, upper encapsulant 130 can cover the lateral sides and top side of electronic components 120a, 120b, or 190. In some examples, the top side of upper encapsulant 130 can be thinned, such as by grinding with a grinding tool, after provision of upper encapsulant 130. In some examples, the top sides of electronic components 120a or 120b, and the top side of upper encapsulant 130, can be substantially coplanar. In some examples, top sides of electronic components 120a or 120b can be grinded or exposed at the top side of upper encapsulant 130 by the grinding process. In some examples, upper encapsulant 130 can be provided by compression molding, transfer molding, liquid encapsulant molding, vacuum lamination, paste printing, or film assisted molding method. In some examples, the thickness of upper encapsulant 130 can be between approximately 100 µm and approximately 1000 µm. Such upper encapsulant 130 can protect electronic components 120*a*, 120*b*, or 190 from external elements or environmental exposure.

FIG. 2C shows a cross-sectional view of electronic device 10 at a later stage of manufacture. In the example shown in FIG. 2C, support carrier 91 and temporary adhesive 92 can be removed from upper encapsulant 130 and electronic components 120*a* or 120*b*, and substrate 110 can be provided in a partially exposed configuration. In some examples, the adhesive strength of temporary adhesive 92 can be reduced or neutralized by light or heat, such that light or heat can be provided to support carrier 91 and temporary adhesive 92 can be removed from electronic components 120*a*, 120*b*, or 190 and upper encapsulant 130. In some examples, substrate 110 can be provided on the bottom sides of electronic components 120*a*, 120*b*, or 190, and the bottom side of upper encapsulant 130. Substrate 110 comprises one or more layers of conductive structure 112 interleaved with one or more layers of dielectric structure 111. Conductive structure 112 can be coupled with component interconnects 121*a*, 121*b*, or 191 of electronic components 120*a*, 120*b*, or 190. Dielectric structure 111 can comprise one or more dielectric layers. Conductive structure 112 can comprise one or more conductive layers defining traces, vias, pads, UBM, or terminals. Inward terminals 1121 can comprise a portion of conductive structure 112 coupled with component interconnects 121*a*, 121*b*, or 191 of electronic components 120*a*, 120*b*. Outward terminals 1122 can comprise a portion of conductive structure 112 to be coupled with external interconnects 170.

In some examples, substrate 110 can be a redistribution layer ("RDL") substrate. RDL substrates can comprise one or more conductive redistribution layers and one or more dielectric layers that (a) can be formed layer by layer over an electronic components to which the RDL substrate is to be electrically coupled, or (b) can be formed layer by layer over a carrier that can be entirely removed or at least partially removed after the electronic components and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic components, or (b) fan-in electrical traces within the footprint of the electronic components. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In some, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias, openings or recesses can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. The embodiment of FIG. 2C can be an example of a sub-assembly in accordance with the present description.

Figure 2D:
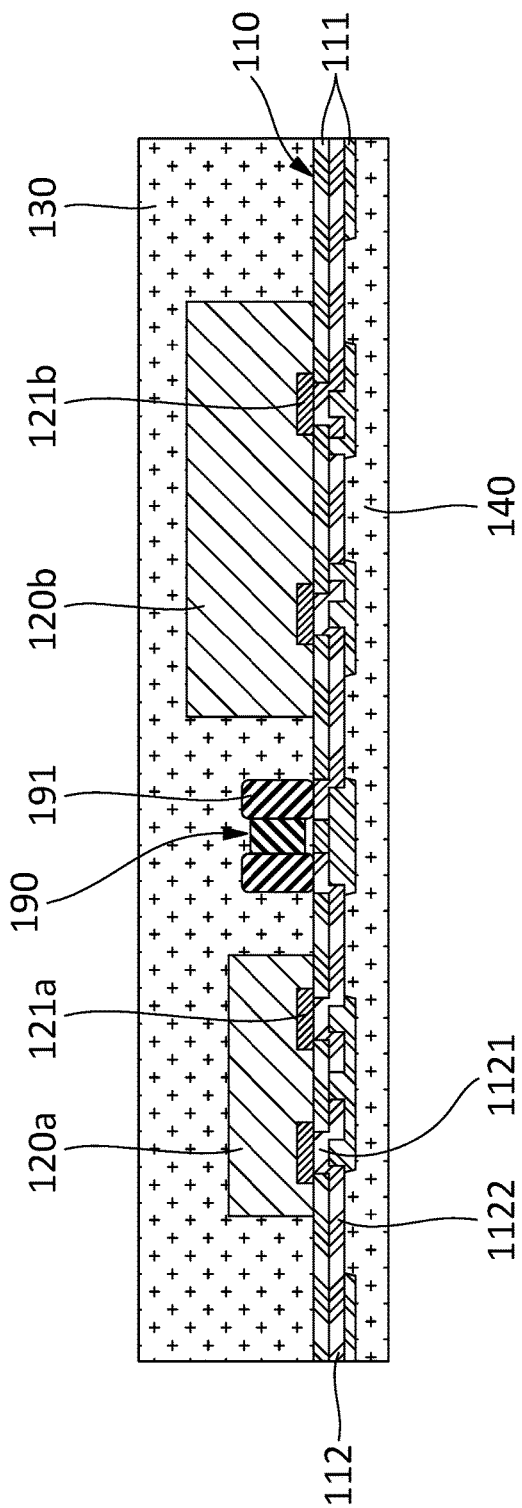

FIG. 2D shows a cross-sectional view of electronic device 10 at a later stage of manufacture. In the example shown in FIG. 2D, lower encapsulant 140 can be provided on the bottom side of substrate 110. In some examples, lower encapsulant 140 can comprise or be referred to as a mold compound, resin, sealant, filler-reinforced polymer, or organic body. In some examples, lower encapsulant 140 can comprise an epoxy resin or a phenol resin, a carbon black, a silica filler, or other materials as known to one of ordinary skill in the art. In some examples, lower encapsulant 140 and upper encapsulant 130 can comprise or consist of a same material. In some examples, the bottom side of lower encapsulant 140 can be thinned, such as by grinding with a grinding tool, after providing lower encapsulant 140 (optional). In some examples, lower encapsulant 140 can be provided by compression molding, transfer molding, liquid encapsulant molding, vacuum lamination, paste printing, or film assisted molding method. In some examples, the thickness of lower encapsulant 140 can be approximately 20 μm to approximately 100 μm. In some examples, the coefficient of thermal expansion of upper encapsulant 130 and lower encapsulant 140 can be similar or identical to each other and accordingly, a warpage of the substrate 110 or the electronic device 10 can be reduced.

FIG. 2E shows a cross-sectional view of electronic device 10 at a later stage of manufacture. In the example shown in FIG. 2E, lower shield 155 can be provided on the bottom side of lower encapsulant 140. Lower shield 155 can comprise or be referred to as an electromagnetic interference (EMI) shield, or a conformal shield that conforms to the contour of lower encapsulant 140.

In some examples, lower shield 155 can be provided by a sputtering process, a plating process, a spray coating process, a plasma deposition process, or a taping process. In some examples, a coating process such as sputtering can provide lower shield 155 as a thin layer having similar shielding function as a thicker pre-formed metal sheet structure would have. In some examples, since the conformal shield can be deposited in the sputtering process in a vacuum, the sputtering process can be superior in quality, such as in terms of density, contact resistance, thin film adhesion, or thickness control, and yield can be high compared to other methods. In some examples, the sputtering process can be performed multiple times for different layers of similar metal or different metals. In some examples, the plating process can be an electroless method of plating through a chemical reaction without using external power source. In some examples, in the plating process, metal ions and a reducing agent can be simultaneously added to the plating solution so the reaction proceeds continuously by a spontaneous reduction reaction. In some examples, an electroplating process can be performed after the electroless plating process. In some examples, the spray coating process can be a coating method using conductive mixed paint made by mixing conductive powder or flake with a resin such as silicone, epoxy, acrylic, or polyurethane. Since the spray coating process proceeds while spraying an ink-type shielding material comprising conductive powder, the spray coating process has high productivity and can be applied to various types of devices. In some examples, spray coating can also be performed multiple times. In some examples, lower shield 155 can comprise copper (Cu), aluminum (Al), nickel (Ni), palladium (Pd), gold (Au), silver (Ag), chromium (Cr), zinc (Zn), tin (Sn), titanium (Ti), iron (Fe), or an alloy of these materials. In some examples, lower shield 155 can comprise a resin such as silicone, epoxy, acrylic, or polyurethane together with conductive filler. In some examples, the thickness of lower shield 155 can be approximately 0.003 mm (millimeters) to 0.010 mm.

Lower shield 155 can block or restrict radiation from electronic components 120a, 120b, or 190 in the direction to the bottom of substrate 110, or can also restrict radiation from reaching electronic components 120a, 120b, or 190 through the bottom of substrate 110.

FIG. 2F shows a cross-sectional view of electronic device 10 at a later stage of manufacture. In the example shown in FIG. 2F, multiple recesses 140a can be provided on lower shield 155 and lower encapsulant 140. In some examples, recess 140a can be provided by patterning parts of lower shield 155 and lower encapsulant 140 by laser ablation or chemical etching. In some examples, part of lower shield 155 can be first removed by laser ablation or chemical etching method, and then part of lower encapsulant 140 can be removed, to define recesses 140a. In some examples, the laser ablation method can be performed without a separate mask, and the chemical etching method can require a separate mask. Outward terminal 1122 can be exposed through recess 140a. In some examples, the diameter or depth of recess 140a can be approximately 100 μm to approximately 500 μm.

FIG. 2G shows a cross-sectional view of electronic device 10 at a later stage of manufacture. In the example shown in FIG. 2G, dielectric buffer 160 can be provided on the bottom side of substrate 110. Dielectric buffer 160 can cover recess 140a, lower encapsulant 140, or lower shield 155. In some examples, dielectric buffer 160 can comprise or be referred to as one or more dielectric layers. In some examples, dielectric buffer 160 can comprise polyimide (PI), benzocyclobutene (BCB), polybenzoxazole (PBO), Si3N4, SiO2 or SiON, which can be provided by physical vapor deposition (PVD), chemical vapor deposition (CVD), printing, spin coating, spray coating, sintering or thermal oxidation method. Dielectric buffer 160 can prevent an electrical short-circuit between lower shield 155 and external interconnect 170 or UBM 171. In some examples, a grinding process can be performed after providing dielectric buffer 160, so that the bottom side of dielectric buffer 160 can be flattened (optional). In some examples, the thickness of dielectric buffer 160 can be approximately 5 μm to approximately 50 μm.

FIG. 2H shows a cross-sectional view of electronic device 10 at a later stage of manufacture. In the example shown in FIG. 2H, multiple recesses 160a can be provided on dielectric buffer 160. In some examples, a part of dielectric buffer 160 can be patterned by a laser ablation method or a chemical etching method to define recess 160a exposing outward terminal 1122 through dielectric buffer 160. Other portions of dielectric buffer 160 can remain covering lower shield 155 and covering lower encapsulant 140 within recess 160a. To achieve this, a photomask exposure zone for patterning dielectric buffer 160 can be adjusted so dielectric buffer 160 is removed along the vertical center portion of recesses 160a, but not from the perimeter wall portions of recesses 160a adjacent lower encapsulant 140. In some examples, outward terminal 1122 can be exposed by recess 160a provided by the patterning process. In some examples, the thickness of dielectric buffer 160 remaining on lower shield 155 and on lower encapsulant 140 within recess 160a, can be approximately 5 μm to approximately 50 μm.

FIG. 2I shows a cross-sectional view of electronic device 10 at a later stage of manufacture. In the example shown in FIG. 2I, UBM 171 can be optionally provided on outward terminal 1122 and recess 160a. UBM 171 can be extended from outward terminal 1122 and along the inner wall of recess 160a of dielectric buffer 160 and can define recess 171a. In some examples, UBM 171 can be considered part of, or an extension of, outward terminal 1122. In some examples, UBM (171) can comprise copper (Cu), silver (Ag), gold (Au), aluminum (Al), nickel (Ni), palladium (Pd), titanium (Ti), chromium (Cr), titanium tungsten (TiW), titanium nickel (TiNi), nickel vanadium (NiV), or other electrically conductive material. In some examples, UBM 171 can be provided using physical vapor deposition (PVD), chemical vapor deposition (CVD), atomic layer deposition (ALD), plasma vapor deposition, electroless plating, or electrolytic plating. In some examples, PVD can be referred to as sputtering. In some examples, the thickness of UBM 171 can be approximately 3 μm to approximately 10 μm. In some cases, UBM 171 can be omitted.

FIG. 2J shows a cross-sectional view of electronic device 10 at a later stage of manufacture. In the example shown in FIG. 2J, external interconnect 170 can be provided on outward terminal 1122. In the present example, external interconnect 170 is provided in recess 171a of UBM 171, and is coupled to substrate 110 via UBM 171. In some examples, external interconnect 170 can comprise or be referred to as a conductive ball, a conductive bump, a conductive pillar, or a solder ball. In some examples, flux can be provided on outward terminal 1122, the solder ball can be dropped on the flux, and then the solder ball can be electrically coupled outward terminal 1122 (or UBM 171) through a reflow process or a laser assisted bonding process. In some examples, external interconnect 170 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, the thickness or width of external interconnect 170 can be approximately 50 μm to approximately 100 μm.

Because of the presence of dielectric buffer 160 covering the bottom of lower shield 155 and the lateral sides of lower shield 155 at recess 160a, UBM 171 and external interconnect 170 can remain electrically isolated from lower shield 155 while still permitting lower shield 155 to cover the bottom side of lower encapsulant 140.

Figure 2K:
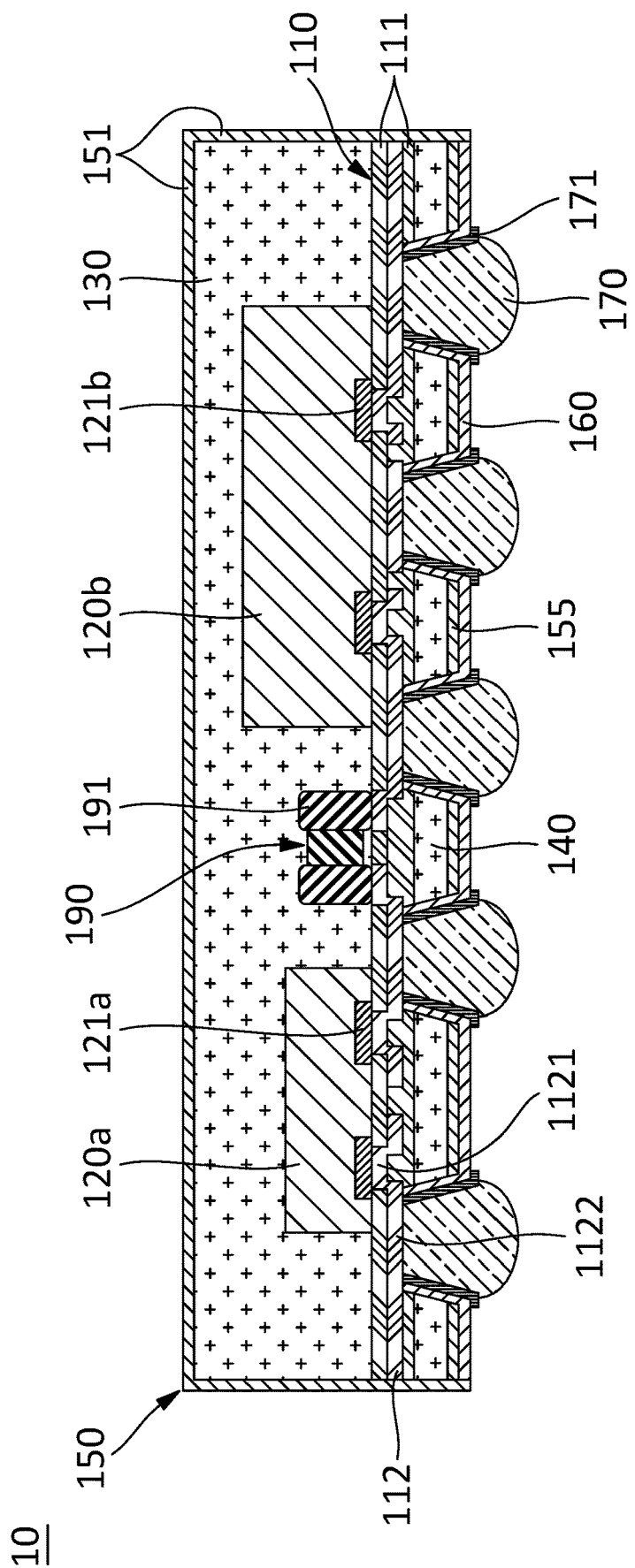

FIG. 2K shows a cross-sectional view of electronic device 10 at a later stage of manufacture. In the example shown in FIG. 2K, upper shield 151 can be provided on the lateral sides and top side of upper encapsulant 130. In some examples, upper shield 151 can extend to cover the lateral sides of substrate 110, the lateral sides of lower encapsulant 140, the lateral sides of lower shield 155, or the lateral sides of dielectric buffer 160. In some examples, upper shield 151 can comprise or be referred to as an EMI shield or conformal shield. In some examples, upper shield 151 can comprise an upper shield top portion covering the top side of upper encapsulant 130 and an upper shield lateral portion covering at least the lateral sides of upper encapsulant 130. In some examples, upper shield 151 can be electrically coupled to lower shield 155 or one or more layers of conductive structure 112. In some examples, a portion of conductive structure 112 coupled with upper shield 151 can be a ground node. In some examples, the material, thickness, or method of manufacturing upper shield 151 can be similar to the material, thickness, or method of manufacturing lower shield 155 described above. Upper shield 151 can block, restrict, or contain lateral or upward radiation from electronic components 120a, 120b, or 190, or can block, restrict, or contain restrict radiation from reaching electronic components 120a, 120b, or 190 through the lateral sides or the top side of upper encapsulant 130.

As described above, example electronic device 10 can comprise upper shield 151 provided at the upper portion, and lower shield 155 provided at the lower portion bounding respective portions of electronic components 120a, 120b, or 190. In some examples, upper shield 151 wraps around approximately five sides (e.g., the top side and four lateral sides) of electronic device 10, and lower shield 155 wraps around approximately one side (e.g., the bottom side) of electronic device 10. Lower shield 155 can be provided on the bottom side of lower encapsulant 140, such as by a sputtering or spraying process. Such an approach can avoid formation of further conductive layers as part of substrate 110, lowering substrate complexity or cost. By locating lower shield 155 under lower encapsulant 140, the number of layers of substrate 110 can be reduced, aiding in the prevention or regulation of warpage of substrate 110. In general, as the number of conductive layers of substrate 110 decreases, the package/substrate warpage phenomenon can be decreased as well. In addition, example electronic device 10 can comprise upper encapsulant 130 at the top side of substrate 110 and lower encapsulant 140 at the bottom side of substrate 110. Where the coefficients of thermal expansion of upper encapsulant 130 and lower encapsulant 140 are similar, and the package/substrate warpage phenomenon can be further reduced. It is understood that in some examples of electronic device 10, upper encapsulant 130 can be replaced by a lid or enclosure that either includes upper shield 151, that comprises a material having shielding characteristics, or combinations of both. In some examples, upper encapsulant 130 and upper shield 151 can be omitted to provide an electronic device having lower encapsulant 140 and lower shield 155 only.

Figure 3:
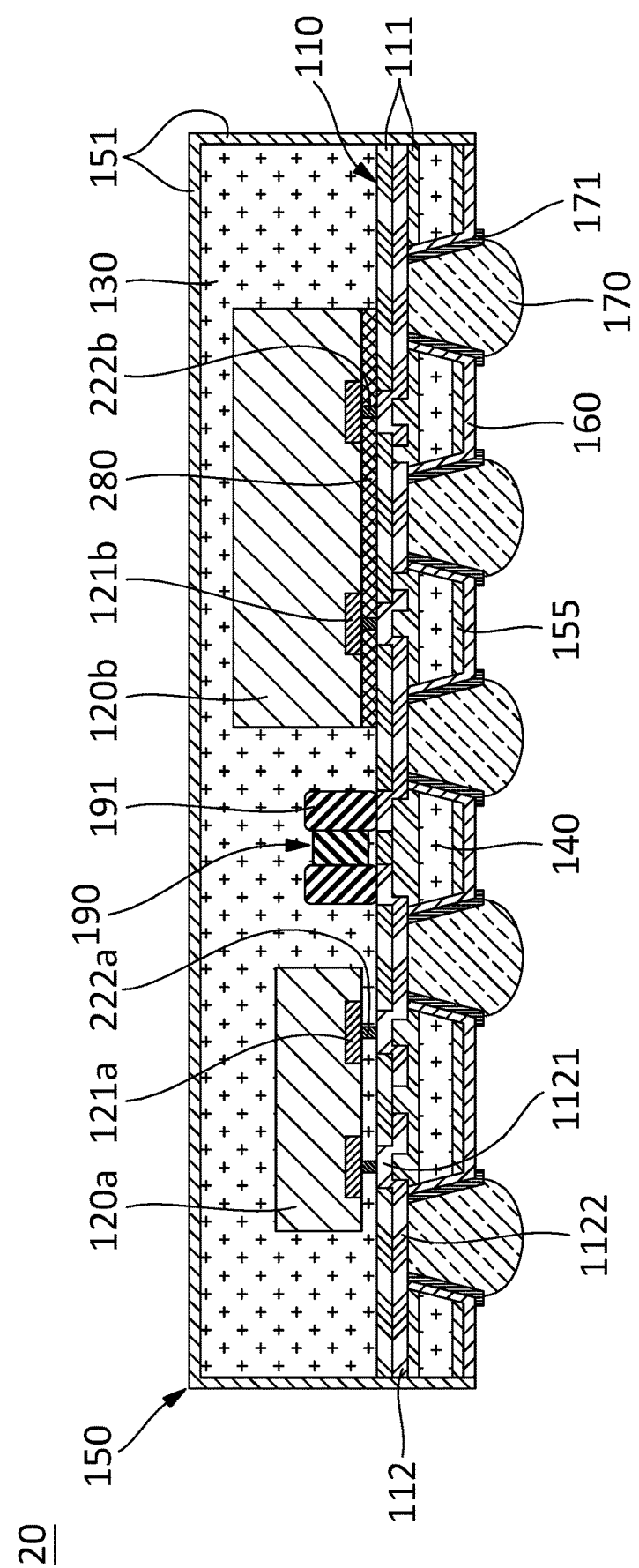
FIG. 3 shows a cross-sectional view of an example electronic device.

FIG. 3 shows a cross-sectional view of an example electronic device 20. Electronic device 20 can be similar to electronic device 10, and comprises electronic components 120a or 120b having respective internal interconnects 222a or 222b coupled to substrate 110. In some examples, internal interconnects 222a or 222b can protrude from, or can be considered part of, respective component interconnects 121a or 121b. In some examples, electronic device 20 can comprise interface dielectric 280 (optional) interposed between the top side of substrate 110 and the bottom sides of electronic components 120a or 120b.

In some examples, internal interconnects 222a or 222b can be interposed between inward terminals 1121 of substrate 110 and component interconnects 121a or 121b of electronic components 120a or 120b. In some examples, internal interconnects 222a or 222b can comprise or be referred to as bumps or pillars with or without solder tips. In some examples, upper encapsulant 130 can be interposed between substrate 110 and electronic components 120a or 120b, and upper encapsulant 130 can cover the lateral sides of internal interconnects 222a or 222b. In some examples, interface dielectric 280 can cover the lateral sides of internal interconnects 222a or 222b, and the lateral sides of interface dielectric 280 can be covered by upper encapsulant 130.

It is understood that in some examples of electronic device 20, upper encapsulant 130 can be replaced by a lid or enclosure that either includes upper shield 151, that comprises a material having shielding characteristics, or that comprises combinations of both. In some examples, upper encapsulant 130 and upper shield 151 can be omitted to provide an electronic device having lower encapsulant 140 and lower shield 155 only.

Figure 4:
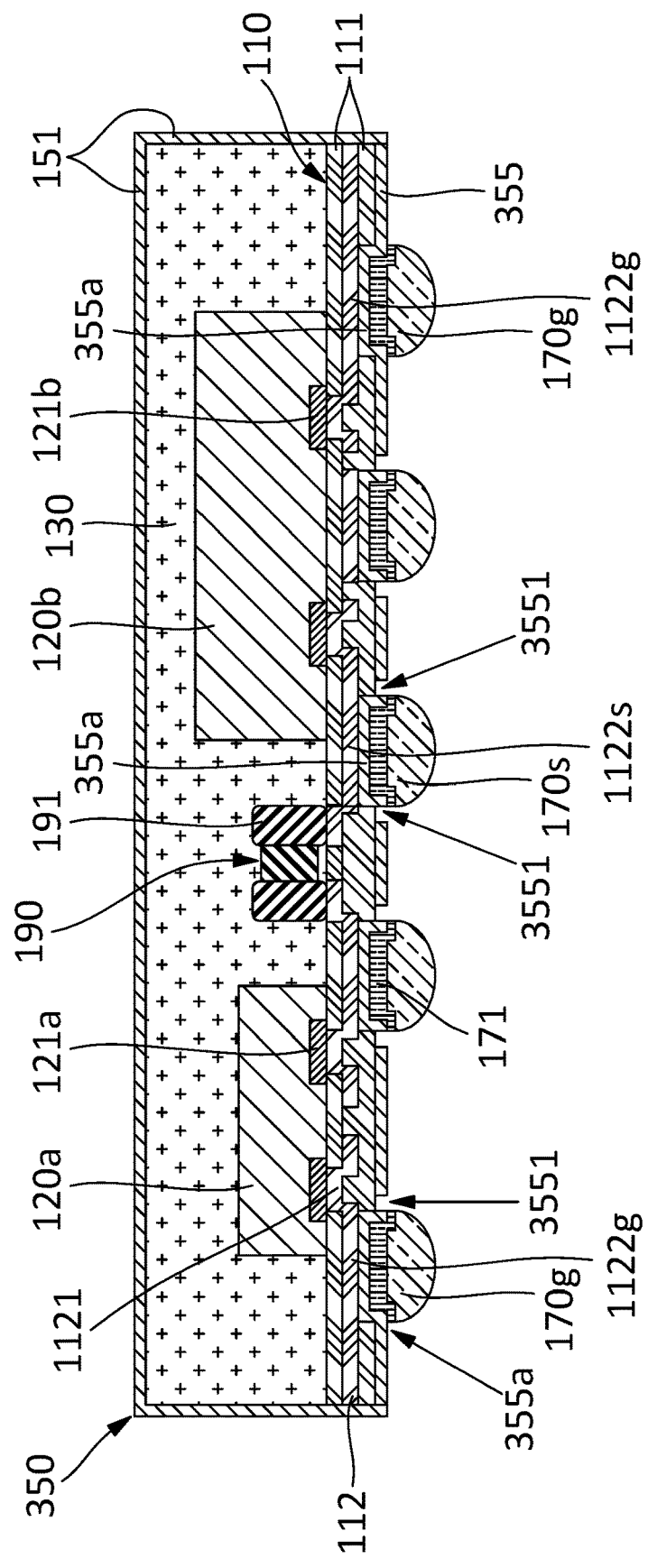
FIG. 4 shows a cross-sectional view of an example electronic device.

FIG. 4 shows a cross-sectional view of an example semiconductor device 30. Semiconductor device 30 can be similar to other semiconductor devices of this disclosure, such as semiconductor device 10 or 20, and device 30 can comprise substrate 110, electronic components 120a and 120b, electronic component 190, upper encapsulant 130, shield 350, and external interconnect 170.

Substrate 110 can comprise dielectric structure 111 and conductive structure 112. Conductive structure 112 can comprise inward terminal 1121 and outward terminal 1122. Electronic components 120a and 120b can comprise component interconnects 121a and 121b. Electronic component 190 can comprise component interconnect 191. Shield 350 can comprise upper shield 151 and lower shield 355. External interconnects 170 can be coupled with outward terminals 1122, whether directly or through optional under bump metallization (UBM) 171. Outward terminals 1122 can comprise ground outward terminals 1122g coupled to a ground node of semiconductor device 30, and signal outward terminals 1122s configured to route input or output signals to or from semiconductor device 30. External interconnects 170 can comprise ground external interconnect 170g coupled to a ground node of semiconductor device 30, and signal external interconnect 170s configured to route input or output signals to or from semiconductor device 30.

In some examples, part of lower shield 355 can be grounded with ground external interconnect 170g, whether directly or through UBM 171. Lower shield 355 can be remain electrically isolated from signal external interconnect 170s. In some examples, lower shield 355 can comprise gap 3551 proximate to signal external interconnect 170s (or corresponding UBM 171) to maintain electrical isolation. Such gap 3551 can be omitted between lower shield 355 and ground external interconnect 170g (or corresponding UBM 171)

Substrate 110, upper encapsulant 130, shield 350, and external interconnect 170 can be referred to as a semiconductor package and package can provide protection for electronic components 120a, 120b, or 190 from external elements or environmental exposure. Additionally, semiconductor package can provide electrical coupling between external electrical components and external interconnects 170.

FIGS. 5A, 5B, 5C, 5D, and 5E show cross-sectional views of an example method for manufacturing electronic device 30. Corresponding aspects of the example method of manufacturing electronic device 30 can be similar to those of the example method of manufacturing electronic device 10.

Figure 5A:
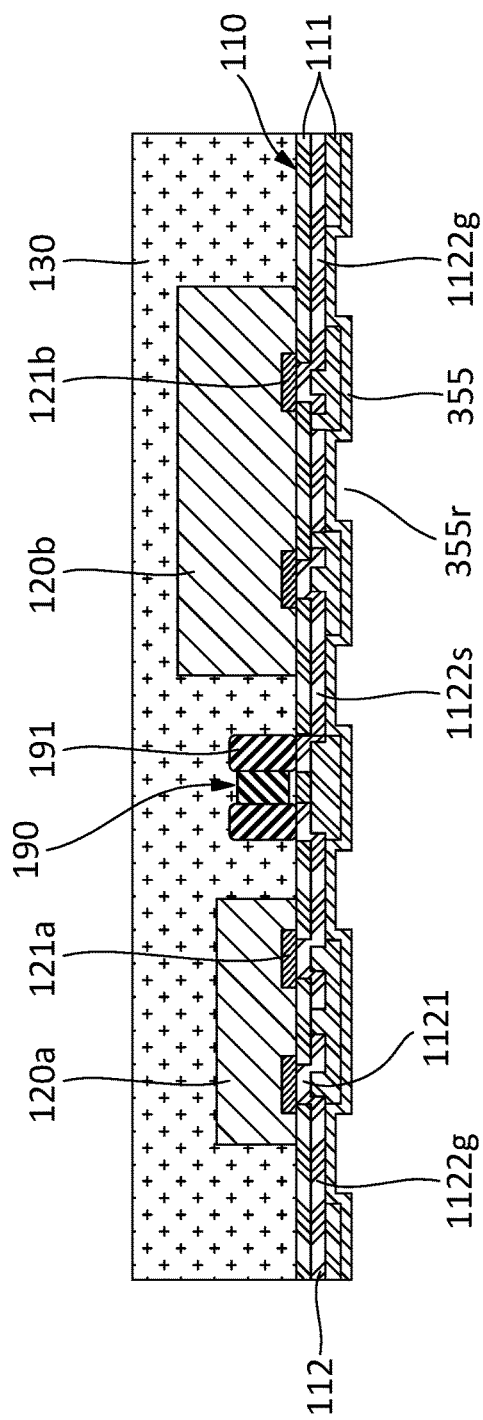

FIG. 5A shows a cross-sectional view of electronic device 30 at a partial stage of manufacture. In the example shown in FIG. 5A, lower shield 355 can be provided as one or more shielding layers on the bottom sides of dielectric structure 111 and of conductive structure 112 of substrate 110.

Lower shield 355 can be provided coupled with one or more of ground outward terminals 1122g. Lower shield 355 can comprise or be referred to as an EMI shield, a conformal shield, or a seed layer. In some examples, lower shield 355 can be provided by a sputtering process, a plating process, a spray coating process, a plasma deposition process, or a taping process. In some examples the material or manufacturing method for lower shield 355 shown in FIG. 5A or can be similar to the material or manufacturing method for lower shield 155 described for FIG. 2E. Lower shield 355 can provide similar shielding effect or performance as described with respect to lower shield 155.

Note that in some examples, electronic device 30 can further comprise a lower encapsulant under substrate 110, similar to lower encapsulant 140. In some examples, lower shield 355 can be provided on the bottom side of such lower encapsulant. In some examples, lower shield 355 can be provided between the bottom side of substrate 110 and the top side of such lower encapsulant. In some examples, such lower encapsulant can comprise recesses similar to recesses 140a, through which lower shield 355 can couple with one or more of ground outward terminals 1122. The embodiment of FIG. 5A can be an example of a sub-assembly in accordance with the present description.

Figure 5B:
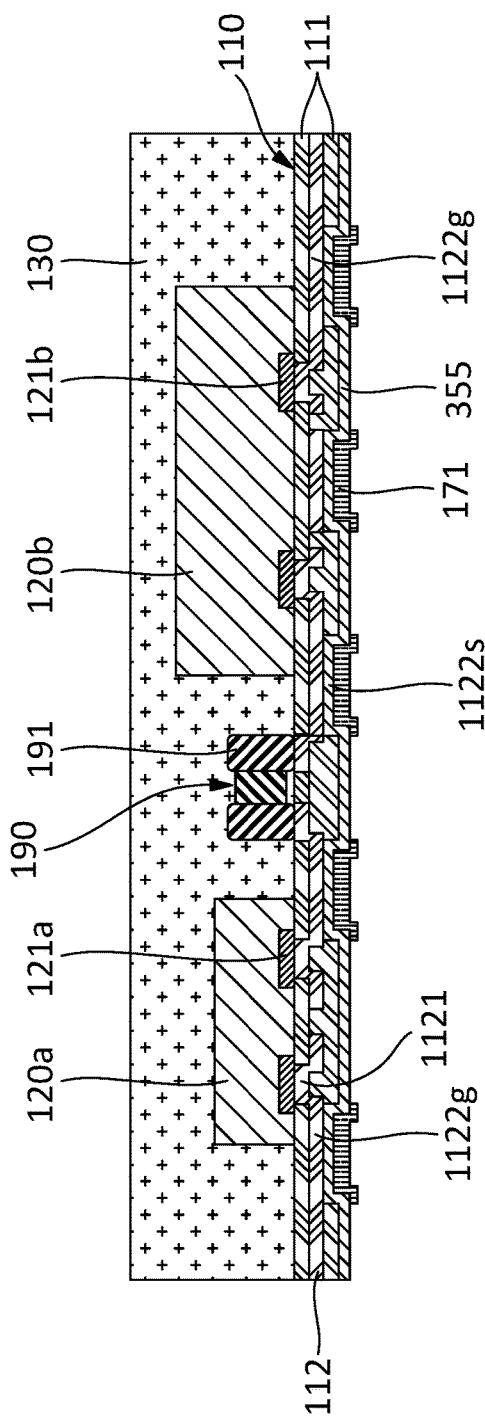

FIG. 5B shows a cross-sectional view of electronic device 30 at a later stage of manufacture. In the example shown in FIG. 5B, UBM 171 can be provided in recess 355r of lower shield 355. UBM 171 can extend along the sidewall and the top side of recess 355r of lower shield 355. Some UBMs 171 can be in recesses 355r coupled over ground outward terminals 1122g, and other UBMs 171 can be in recesses 355r coupled over signal outward terminals 1122s. At the stage of FIG. 5B, recesses 355r and UBMs 171 can remain laterally shorted together by lower shield 355. In some examples, UBM (171) can comprise copper (Cu), silver (Ag), gold (Au), aluminum (Al), nickel (Ni), palladium (Pd), titanium (Ti), chromium (Cr), titanium tungsten (TiW), titanium nickel (TiNi), nickel vanadium (NiV), or other electrically conductive material. In some examples, the material or manufacturing of UBM 171 shown in FIG. 5B can be similar as described with respect to FIG. 2I.

FIG. 5C shows a cross-sectional view of electronic device 30 at a later stage of manufacture. In the example shown in FIG. 5C, a selective removal process can be applied to remove gap portions of lower shield 355 to define gaps 3551. Gaps 3551 through lower shield 355 can be defined, around recesses 355r or UBMs 171 that are positioned on signal outward terminals 1122s, to electrically isolate them from lower shield 355. Gaps 3551 can be partially or fully omitted, around recesses 355r or UBMs 171 that are positioned on ground outward terminals 1122g, to maintain lower shield 355 electrically coupled to them and to the ground node. In some examples, the selective removal can be performed by a laser ablation method or a chemical etching method. In some examples, a part of lower shield 355 can be patterned (removed) by the laser ablation method or the chemical etching method. In some examples, the laser ablation method can be performed without a separate mask, and the chemical etching method can be carried out using a separate mask.

FIG. 5D shows a cross-sectional view of electronic device 30 at a later stage of manufacture. In the example shown in FIG. 5D, external interconnects 170 can be provided on outward terminals 1122 or UBMs 171. Signal external interconnects 170s coupled with signal outward terminals 1122s, such as through respective recesses 355r or UBMs 171, will be electrically isolated from lower shield 355 by gaps 3551. Ground external interconnects 170s coupled with ground outward terminals 1122g, such as through respective recesses 355r or UBMs 171, will remain electrically coupled with lower shield 355. In some examples, the material or manufacturing of external interconnects 170 shown in FIG. 5D can be similar as described with respect to FIG. 2J.

Figure 5E:
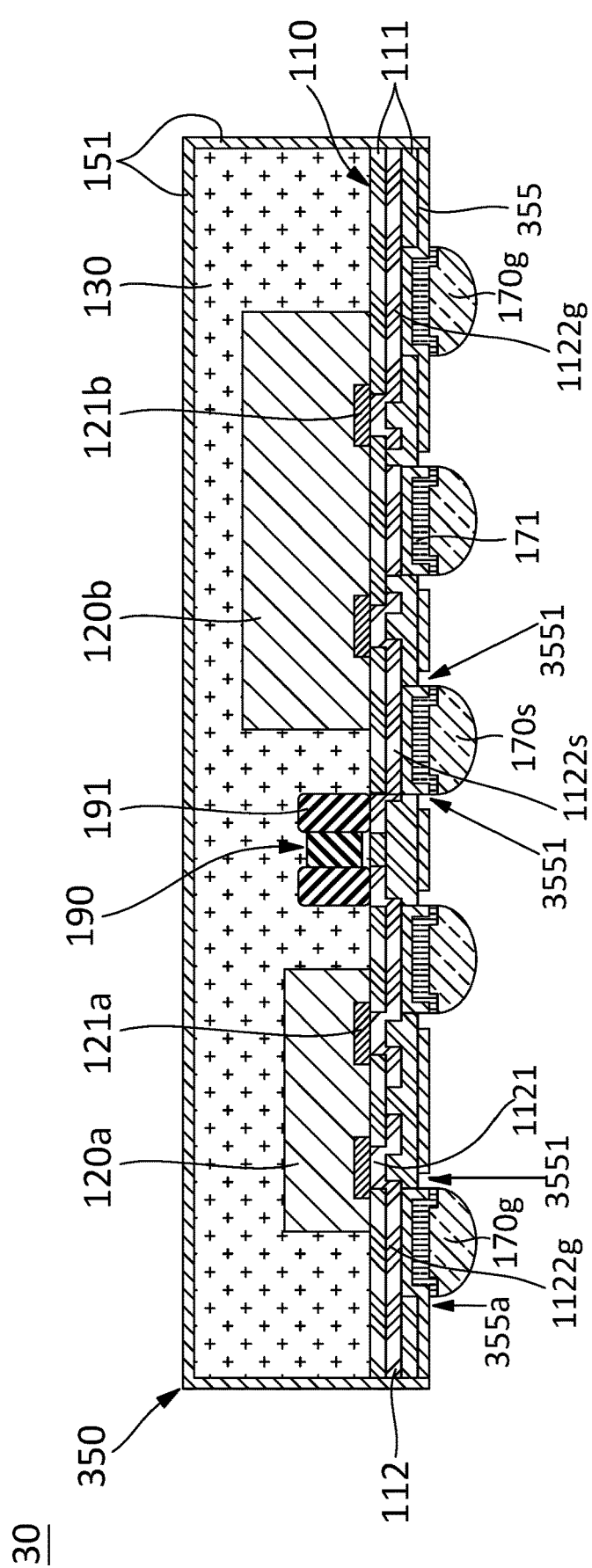

FIG. 5E shows a cross-sectional view of electronic device 30 at a later stage of manufacture. In the example shown in FIG. 5E, upper shield 151 can be provided on the lateral sides and top side of upper encapsulant 130. In some examples, upper shield 151 can be provided on the lateral sides of substrate 110 and the lateral sides of lower shield 355. In some examples, upper shield 151 can comprise or be referred to as an EMI shield or a conformal shield. In some examples, upper shield 151 can be coupled to lower shield 355. In some examples, the material or manufacturing of upper shield 151 shown in FIG. 5E can be similar as described with respect to FIG. 2K. Upper shield 151 can provide similar shielding effect or performance as described for lower shield 152 with respect to FIG. 2K.

It is understood that in some examples of electronic device 30, upper encapsulant 130 can be replaced by a lid or enclosure that either includes upper shield 151, that comprises a material having shielding characteristics, or that comprises combinations of both. In some examples, upper encapsulant 130 and upper shield 151 can be omitted to provide an electronic device having lower shield 355 only.

Figure 6:
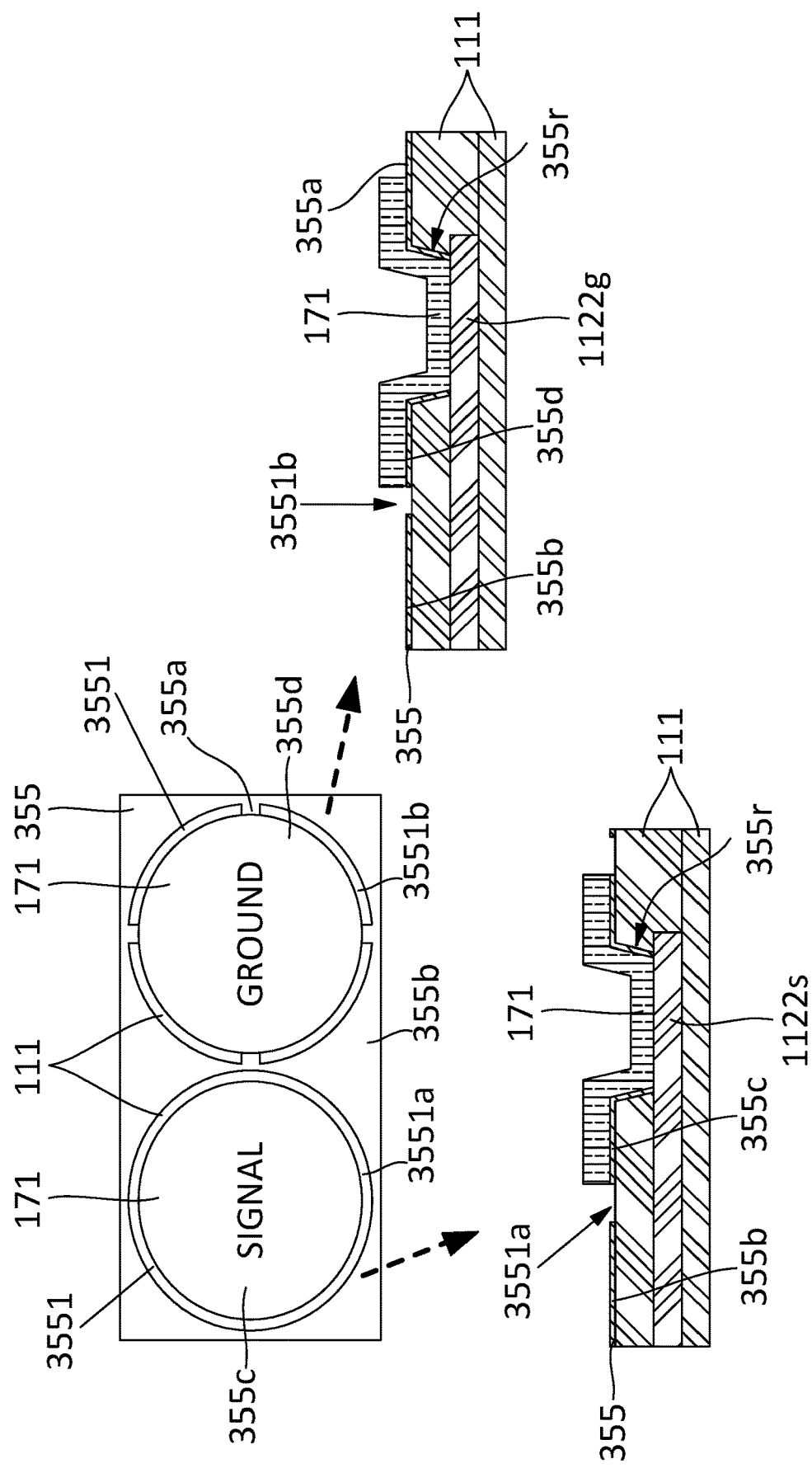
FIG. 6 shows a plan view and a cross-sectional view of an example semiconductor device.

FIG. 6 shows detail plan view and cross-sectional view of portions of an implementation of semiconductor device 30, where lower shield 355 remains electrically isolated from signal outward terminal 1122s by gap 3551. In some examples, lower shield 355 can comprise gap 3551 partially around recess 355r over ground outward terminal 1122g, but lower shield 355 can remain coupled to ground outward terminal 1122g, via UBM 171 or recess 355r, through bridge 355a across gap 3551. In some examples gap 3551 can just be omitted around recess 355r over ground outward terminal 1122g, with bridge 355a occupying the space of gap 3551 as a continuation between first part 355b and third part 355d of lower shield 355. In some examples, bridge 355a can be defined by the same selective removal process described for forming gaps 3551.

FIG. 6 details lower shield 355 comprising a first part 355b and a second part 355c that are laterally separated by a first gap 3551a. First part 355b laterally surrounds the lateral sides of external interconnects 170, and second part 355c is vertically interposed between signal outward terminals 1122s and the respective external interconnect 170. FIG. 6 also details lower shield 355 comprising a third part 355d that is vertically interposed between ground outward terminal 1122g and a respective external interconnect 171. Third part 355d can be laterally separated from first part 355b by a second gap 3551b, and bridge 355a can extend across second gap 3551b to connect third part 355d to first part 355b of lower shield 355. In this way an electrical connection is provided.

Example electronic device 30 can comprise lower shield 355 electrically coupled to the ground region and electrically isolated from the signal region, but lower shield 355 can be electrically coupled to upper shield 151. Accordingly, the signal region does not interfere with lower shield 355, so it can be electrically coupled to external device, and also upper shield 151 and lower shield 355 are grounded, so shield performance for the high frequency device can be improved.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
a substrate comprising a substrate top side, a substrate bottom side, and outward terminals;
a first electronic component coupled to the substrate;
external interconnects coupled to the outward terminals including a first external interconnect coupled to a first outward terminal; and
a lower shield adjacent to the substrate bottom side and laterally between the external interconnects, wherein:
the lower shield is electrically isolated from the first external interconnect by one or more of:
a dielectric buffer interposed between the lower shield and the first external interconnect; or
the lower shield comprising a first part and a second part, the first part being laterally separated from the second part by a first gap, wherein:
the first part of the lower shield laterally surrounds lateral sides of the first external interconnect; and
the second part of the lower shield is vertically interposed between the first outward terminal and the first external interconnect.

2. The electronic device of claim 1, further comprising:
an upper encapsulant covering the first electronic component, the upper encapsulant comprising an upper encapsulant top side and upper encapsulant lateral sides; and
an upper shield adjacent to the upper encapsulant top side and the upper encapsulant lateral sides.

3. The electronic device of claim 1, wherein:
the lower shield is electrically isolated from the first external interconnect by the dielectric buffer;
the electronic device further comprises a lower encapsulant interposed between the lower shield and the substrate bottom side;
the lower encapsulant comprises recesses extending inward to the outward terminals; and
the dielectric buffer is disposed over sidewalls of the recesses.

4. An electronic device, comprising:
a substrate comprising:
a substrate top side;
a substrate bottom side opposite to the substrate top side;
substrate lateral sides;
a conductive structure comprising inward terminals and outward terminals; and
a dielectric structure covering portions of the conductive structure;
a first electronic component coupled to inward terminals adjacent to the substrate top side;
a first encapsulant covering portions of the substrate and at least portions of the first electronic component, the first encapsulant comprising a first encapsulant top side and first encapsulant lateral sides;
external interconnects coupled to the outward terminals including a first external interconnect coupled to a first outward terminal;
a first shield adjacent to the first encapsulant top side and the first encapsulant lateral sides; and
a second shield adjacent to the substrate bottom side and laterally between the external interconnects, wherein:
the second shield is electrically isolated from the first external interconnect by one or more of:
a dielectric buffer interposed between the second shield and the first external interconnect; or
the second shield comprising a first part and a second part, the first part being laterally separated from the second part by a first gap, wherein:
the first part of the second shield laterally surrounds lateral sides of the first external interconnect; and
the second part of the second shield is vertically interposed between the first outward terminal and the first external interconnect.

5. The electronic device of claim 4, wherein:
the second shield is electrically isolated from the first external interconnect by the dielectric buffer.

6. The electronic device of claim 5, further comprising:
a second encapsulant interposed between the second shield and the substrate bottom side.

7. The electronic device of claim 6, wherein:
the second encapsulant comprises recesses extending inward to the outward terminals; and
the dielectric buffer is disposed over sidewalls of the recesses.

8. The electronic device of claim 7, wherein:
the second shield is interposed between the second encapsulant and the dielectric buffer; and the sidewalls of the recesses are exposed from the second shield.

9. The electronic device of claim 4, wherein:
the second shield is electrically isolated from the first external interconnect by the first gap.

10. The electronic device of claim 9, wherein:
the external interconnects comprise a second external interconnect;
the second shield comprises a third part that is vertically interposed between a second outward terminal and the second external interconnect;
the third part of the second shield is laterally separated from the first part of the second shield by a second gap; and
the second shield further comprises a bridge that extends across the second gap to couple the third part of the second shield to the first part of the second shield.

11. The electronic device of claim 4, wherein:
the first shield covers the substrate lateral sides; and
the first shield and the second shield are coupled together.

12. The electronic device of claim 4, wherein:
the substrate comprises a redistribution layer (RDL) substrate;
the first electronic component is flip-chip coupled to the inward terminals with internal interconnects; and
the electronic device further comprises an interface dielectric interposed between the substrate top side and a side of the first electronic component that is proximate to the substrate top side.

13. The electronic device of claim 1, wherein:
the lower shield is electrically isolated from the first external interconnect by the first gap.

14. The electronic device of claim 13, wherein:
the external interconnects comprise a second external interconnect;
the lower shield comprises a third part that is vertically interposed between a second outward terminal and the second external interconnect;
the third part of the lower shield is laterally separated from the first part of the lower shield by a second gap; and
the lower shield further comprises a bridge that extends across the second gap to couple the third part of the lower shield to first part of the lower shield.

15. A method of manufacturing an electronic device, comprising:
providing a sub-assembly comprising:
a substrate comprising:
a substrate top side;
a substrate bottom side opposite to the substrate top side,
substrate side sides;
a conductive structure comprising inward terminals and outward terminals; and
a dielectric structure covering portions of the conductive structure;
a first electronic component coupled to the substrate top side; and
a first encapsulant covering portions of the substrate and at least portions of the first electronic component, the first encapsulant comprising a first encapsulant top side and first encapsulant lateral sides;
forming first shield over the first encapsulant top side and the first encapsulant lateral sides;
forming a second shield over the substrate bottom side;
providing external interconnects adjacent to the substrate bottom side and coupled to the outward terminals including a first external interconnect coupled to a first outward terminal; and
electrically isolating the second shield from a first external interconnect by one or more of:
providing a dielectric buffer interposed between the second shield and the first external interconnect; or
providing the second shield comprising a first part and a second part, the first part being laterally separated from the second part by a first gap, wherein:
the first part of the second shield laterally surrounds lateral sides of the first external interconnect; and
the second part of the second shield is vertically interposed between the first outward terminal and the first external interconnect.

16. The method of claim 15, wherein:
electrically isolating comprises providing the dielectric buffer interposed between the second shield and the first external interconnect.

17. The method of claim 16, further comprising:
providing a second encapsulant before providing the second shield so that the second encapsulant is interposed between the second shield and the substrate bottom side; and
providing recesses in the second encapsulant to expose the outward terminals,
wherein:
providing the dielectric buffer comprises:
providing the dielectric buffer over sidewalls of the recesses; and
providing dielectric buffer overlying the second shield so that the second shield is interposed between the second encapsulant and the dielectric buffer; and
the sidewalls of the recesses are exposed from the second shield.

18. The method of claim 15, wherein:
electrically isolating comprises providing the second shield comprising the first gap.

19. The method of claim 18, wherein:
providing the external interconnects comprises providing a second external interconnect; and
forming the second shield comprises:
forming a third part that is vertically interposed between a second outward terminal and the second external interconnect, wherein the third part of the second shield is laterally separated from the first part of the second shield by a second gap; and
forming bridges across the second gap to electrically couple the third part to the first part, wherein the bridges are separated by portions of the second gap.

20. The method of claim 15, wherein providing the sub-assembly comprises:
providing support carrier;
attaching the first electronic component to the support carrier;
forming the first encapsulant;
after forming the first encapsulant, removing the support carrier; and
after removing the support carrier, providing the substrate comprising a redistribution layer (RDL) substrate electrically coupled to the first electronic component.

* * * * *